United States Patent
Choi et al.

(10) Patent No.: US 11,380,652 B2
(45) Date of Patent: Jul. 5, 2022

(54) MULTI-LEVEL DISTRIBUTED CLAMPS

(71) Applicant: INTEL CORPORATION, Santa Clara, CA (US)

(72) Inventors: Beomseok Choi, Chandler, AZ (US); Kaladhar Radhakrishnan, Chandler, AZ (US); William Lambert, Chandler, AZ (US); Michael Hill, Gilbert, AZ (US); Krishna Bharath, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 16/635,501

(22) PCT Filed: Sep. 29, 2017

(86) PCT No.: PCT/US2017/054634
§ 371 (c)(1),
(2) Date: Jan. 30, 2020

(87) PCT Pub. No.: WO2019/066976
PCT Pub. Date: Apr. 4, 2019

(65) Prior Publication Data
US 2020/0251448 A1    Aug. 6, 2020

(51) Int. Cl.
*H01L 25/065*    (2006.01)
*H01L 23/528*    (2006.01)
(Continued)

(52) U.S. Cl.
CPC ...... *H01L 25/0657* (2013.01); *H01L 23/5223* (2013.01); *H01L 23/5286* (2013.01);
(Continued)

(58) Field of Classification Search
CPC ......... H01L 27/0285; H01L 2224/0239; H01L 25/0657; H01L 24/13
See application file for complete search history.

(56) References Cited

U.S. PATENT DOCUMENTS

| 9,129,935 B1 * | 9/2015 | Chandrasekar ......... H01L 23/50 |
| 2003/0081389 A1 | 5/2003 | Nair et al. |

(Continued)

FOREIGN PATENT DOCUMENTS

JP    2013077656    4/2013

OTHER PUBLICATIONS

International Search Report and Written Opinion for International Patent Application No. PCT/US17/54634, dated Jun. 28, 2018.
(Continued)

*Primary Examiner* — Nicholas J Tobergte
*Assistant Examiner* — David J Goodwin
(74) *Attorney, Agent, or Firm* — Essential Patents Group, LLP

(57) ABSTRACT

An apparatus is provided which comprises: a first set of one or more contacts on a first die surface, the first set of one or more contacts to couple with contacts of an integrated circuit die, one or more multi-level voltage clamps coupled with the first set of one or more contacts, the one or more multi-level voltage clamps switchable between two or more voltages, one or more integrated voltage regulators coupled with the one or more multi-level voltage clamps, the one or more integrated voltage regulators to provide an output voltage, one or more through silicon vias (TSVs) coupled with the one or more integrated voltage regulators, and a second set of one or more contacts on a second die surface, opposite the first die surface, the second set of one or more contacts coupled with the one or more TSVs, and the second set of one or more contacts to couple with contacts of a package (Continued)

substrate. Other embodiments are also disclosed and claimed.

15 Claims, 7 Drawing Sheets

(51) Int. Cl.
    *H01L 23/522*     (2006.01)
    *H01L 25/00*     (2006.01)

(52) U.S. Cl.
    CPC .... *H01L 25/50* (2013.01); *H01L 2225/06513* (2013.01); *H01L 2225/06544* (2013.01)

(56) References Cited

U.S. PATENT DOCUMENTS

| | | |
|---|---|---|
| 2009/0001568 A1 | 1/2009 | Mancera et al. |
| 2011/0175198 A1* | 7/2011 | Zhan ................ H01L 21/8228 257/592 |
| 2012/0307406 A1* | 12/2012 | Tatsumi ............. H01L 27/0285 361/56 |
| 2013/0082261 A1 | 4/2013 | Saito et al. |
| 2014/0035155 A1 | 2/2014 | Tan et al. |
| 2014/0035892 A1 | 2/2014 | Shenoy et al. |
| 2016/0093588 A1 | 3/2016 | Wang et al. |
| 2016/0260690 A1 | 9/2016 | Ganesan et al. |
| 2016/0372449 A1 | 12/2016 | Rusu et al. |
| 2017/0012545 A1 | 1/2017 | Wang et al. |
| 2018/0026440 A1* | 1/2018 | Zhao ..................... H02H 9/042 361/56 |
| 2019/0089150 A1* | 3/2019 | Gharibdoust ....... H01L 27/0255 |

OTHER PUBLICATIONS

International Preliminary Report on Patentability for PCT Application No. PCT/US17/54634, dated Apr. 9, 2020.
Extended European Search Report for European Patent Application No. 17926548.3, dated Apr. 19, 2021.

* cited by examiner

800

900

MULTI-LEVEL DISTRIBUTED CLAMPS

CLAIM OF PRIORITY

This Application is a National Stage Entry of, and claims priority to, PCT Application No. PCT/US17/54634, filed on 29 Sep. 2017 and titled "MULTI-LEVEL DISTRIBUTED CLAMPS", which is incorporated by reference in its entirety for all purposes.

BACKGROUND

In semiconductor devices, power may be needed intermittently in bursts to meet computing demands. Having power delivery components on a system board near the semiconductor device could lead to relatively long current paths through which power is provided. Some problems with long current paths can include increased impedance and voltage droop when bursts of power are required. Some attempts to deal with these problems have included integration of voltage regulation components onto an integrated circuit die.

FIG. 1 illustrates a perspective view of a monolithic power delivery solution, according to some embodiments. As shown, die 100 includes core region 102, integrated voltage regulator 104, clamps 106, high power demand area 108, and current paths 110. Integrated voltage regulator 104 may regulate an input voltage, provided by through silicon vias (not shown), for example, to an output voltage needed by integrated circuits in core regions 102. Clamps 106 may include circuitry to stabilize and/or supplement an output voltage as a final delivery mechanism before power is transmitted, for example along current paths 110 to high demand area 108. With clamps 106 located along a periphery of die 100, it's possible that current paths 110 may be relatively long, particularly for demand areas near a center of die 100.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
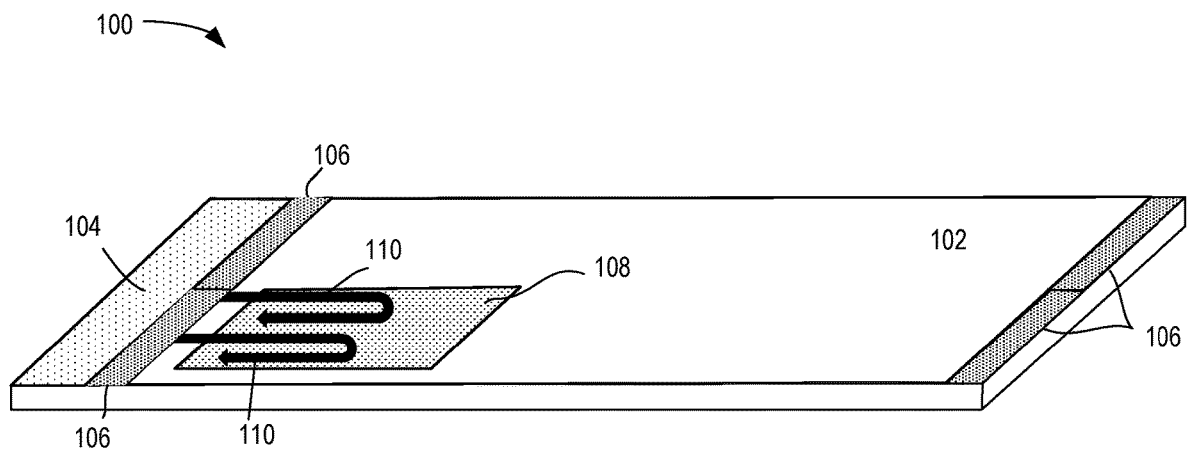
FIG. 1 illustrates a perspective view of a monolithic power delivery solution, according to some embodiments.

Multi-level distributed clamps are generally presented. In this regard, embodiments of the present disclosure enable shorter current loops with lower parasitics. Multi-level clamps may be placed in an adjacent die directly under core loads to selectively focus power delivery to high demand areas. One skilled in the art would appreciate that this approach may enable faster power response with less droop.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 2:
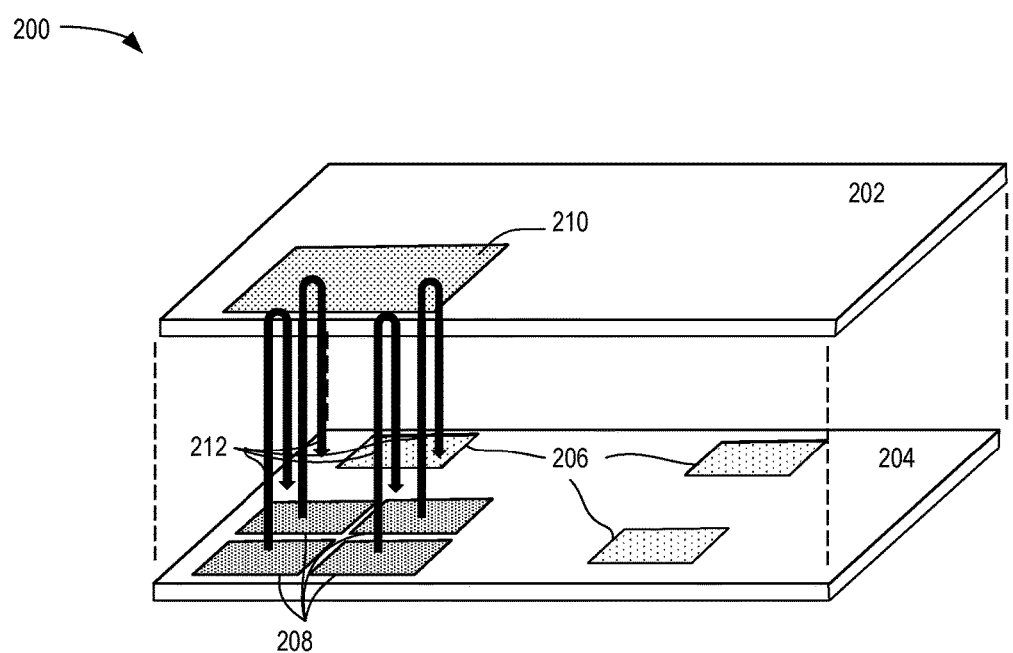
FIG. 2 illustrates a perspective view of a stacked die power delivery solution, according to some embodiments.

FIG. 2 illustrates a perspective view of a stacked die power delivery solution, according to some embodiments. As shown, die stack 200 includes core die 202, power die 204, loosely distributed clamps 206, tightly distributed clamps 208, high demand area 210, and current loops 212. While shown as being spaced apart for illustrative purposes, core die 202 and power die 204 would be closely coupled, for example through microbumps, in some embodiments. In some embodiments, core die 202 may include one or more processors, controllers, or other integrated circuits with specific power requirements. High demand area 210 may represent a concentration of transistors or devices that may have higher power needs than other portions of die 202.

Power die 204 may include integrated voltage regulators and other components in addition to clamps 206 and 208. Clamps 206 and 208 may include multi-level clamps that are shown in more detail hereinafter. In some embodiments, tightly distributed clamps 208 may be designed and sited to provide power to high demand area 210 of die 202 while loosely distributed clamps 206 may be designed and sited to provide power to other portions of die 202.

When core die 202 and power die 204 are coupled, current loops 212 may have significantly shorter lengths compared to current loops 110, for example.

Figure 3:
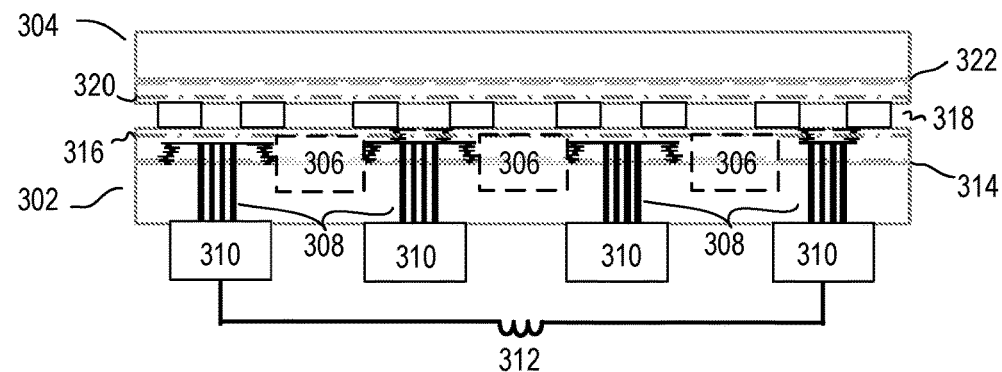
FIG. 3 illustrates a cross-sectional view of a stacked die power delivery solution, according to some embodiments.

FIG. 3 illustrates a cross-sectional view of a stacked die power delivery solution, according to some embodiments. As shown, die stack 300 includes, power die 302, core die 304, power circuits 306, through silicon vias (TSVs) 308, bumps 310, inductor 312, active layer 314, capacitor layer 316, micro-bumps 318, capacitor layer 320, and active layer 322. In some embodiments, die stack 300 may include features shown in reference to other figures shown herein, for example die stack 200. Power circuits 306 of power dies 302 may include multi-level clamps and/or voltage regulation components known in the art and/or as described in more detail in reference to other figures shown herein. Power circuits 306 may be supplied by TSVs 308 with power and ground that may enter power die 302 through bumps 310. In some embodiments, bumps 310 may represent controlled collapse chip connection (C4) bumps for coupling power die 302 with a package substrate or printed circuit board, for example.

In addition to power and ground inputs, in some embodiments a voltage output and bridge voltage are provided to/from power circuits 306 through TSVs 308 and bumps 310, In some embodiments, inductor 312 may be included (within power die 302, in a package substrate, or elsewhere) as part of a feedback loop. Power die 302 may include integrated circuit components, either within power circuits 306 or separate from power circuits 306, in active layer 314, while in other embodiments, components may be included in various other layers. Power circuits 306 may pass power and ground through capacitor layer 316, which may include metal insulator metal (MIM) or other capacitors (or diodes) to mitigate against voltage spikes.

Micro-bumps 318 may be arranged in power and ground pairs and sited to minimize current loop lengths between power die 302 and core die 304. In some embodiments, core die 304 may also include a capacitor layer 320 to buffer a voltage and/or protect against voltage spikes. In some embodiments, core die 304 may include one or more active layers 322 that may include transistors or other integrated circuits that draw power when active.

Figure 4:
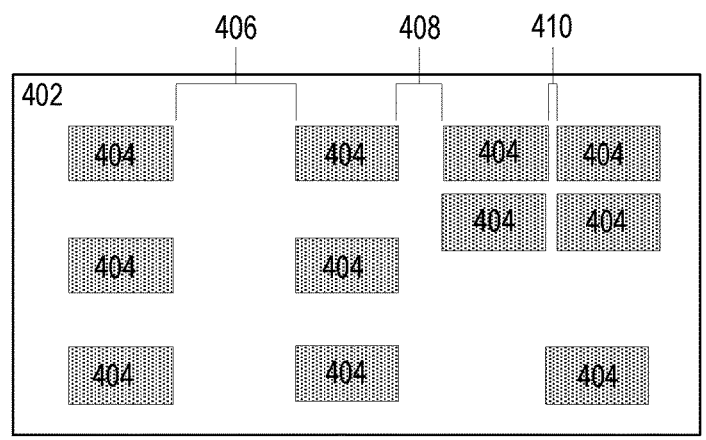
FIG. 4 illustrates a plan view of multi-level clamp distribution on a die, according to some embodiments.

FIG. 4 illustrates a plan view of multi-level clamp distribution on a die, according to some embodiments. As shown, die 400 includes semiconductor material 402, multi-level clamps 404, and clamp spacings 406, 408, and 410. In some embodiments, clamps 404 may be located on a plane close to a surface of die 400 for coupling with a core die. In some embodiments, semiconductor material 402 may be silicon or any other appropriate semiconductor material for integrating clamps 404. Clamps 404 may be homogenous or heterogenous based on the power needs of an associated core die. In some embodiments, clamps 404 may be more densely distributed in areas that are designed to be coupled with high power demand areas of a core die. While shown as having three different clamp spacings 406, 408 and 410, die 400 may have any number of different clamp spacings.

Figure 5:
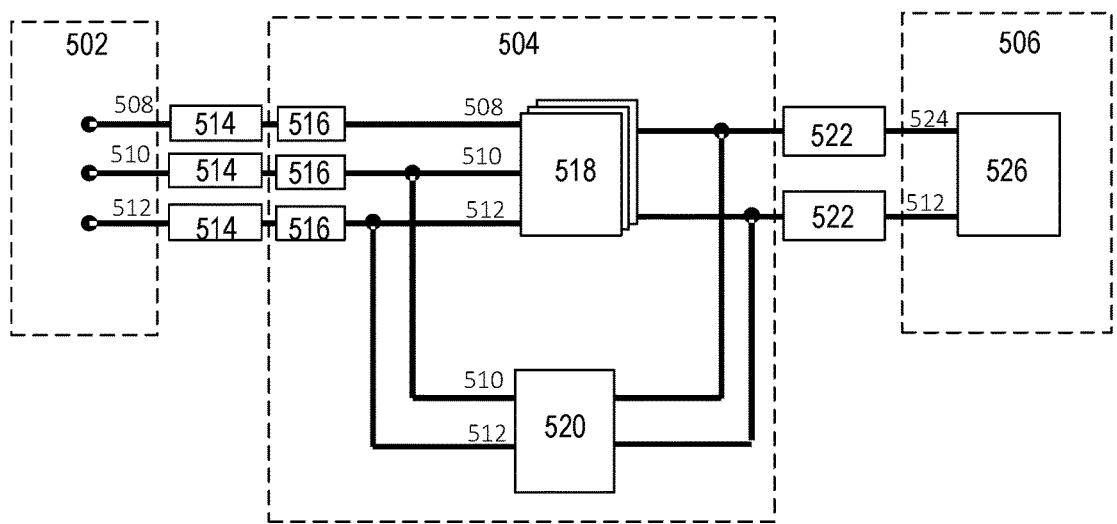
FIG. 5 illustrates a circuit diagram including multi-level distributed clamps, according to some embodiments.

FIG. 5 illustrates a circuit diagram including multi-level distributed clamps, according to some embodiments. As shown, power delivery circuit 500 includes package 502, power die 504, core die 506, high voltage input 508, low voltage input 510, ground 512, bumps 514, TSVs 516, multi-level clamps 518, voltage regulator 520, micro-bumps 522, low voltage output 524, and core 526. Package 502 may represent a package substrate or system board, for example, and may include power delivery components to provide, in some embodiments, high voltage input 508 (which may several volts), low voltage input 510 (which may be about one volt), and ground 512 (or other reference signal). Package 502 may interface with power die 504 through bumps 514, which may be C4 bumps. In some embodiments, TSVs 516 route low voltage input 510 and ground 512 to multi-level clamps 518 and voltage regulator 520, as well as high voltage input 508 to multi-level clamps 518. In other embodiments, different inputs may be provided or clamps 518 and voltage regulator 520 may be combined or implemented in different ways.

In some embodiments, voltage regulator 520 may be a fully integrated voltage regulator (FIVR), while in other embodiments voltage regulator 520 may be partially integrated or co-integrated with multi-level clamps 518. As shown in more detail hereinafter, voltage regulator 520 may generate a low voltage output 524 (less than about one volt) that is transmitted to core die 506 (and core 526) through micro-bumps 522. In some embodiments, multi-level clamps 518 may be able to provide a higher voltage to core 526 than voltage regulator 520 when necessary to prevent voltage droop, for example when a power demand spikes.

Figure 6:
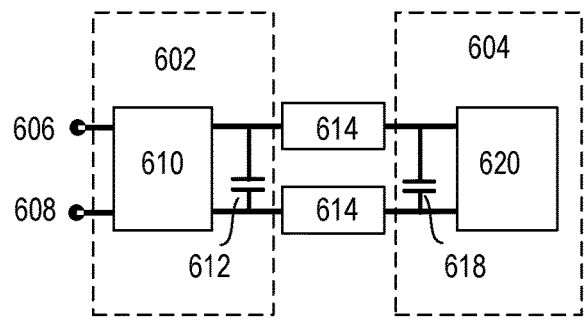
FIG. 6 illustrates a diagram of a multi-level distributed clamp interface with a core, according to some embodiments.

FIG. 6 illustrates a diagram of a multi-level distributed clamp interface with a core, according to some embodiments. As shown, interface 600 includes power die 602, core die 604, input voltage 606, ground 608, multi-level clamp 610, MIM 612, micro-bumps 614, MIM 618, and core 620. In some embodiments, there is a one-to-one correspondence between each multi-level clamp 610 and serviced core 620, while in other embodiments there may be a two-to-one, one-to-two or any other correspondence ratio. Input voltage 606 and ground 608 may be selectively provided to core 620 of core die 604 by multi-level clamp 610 of power die 602 through a pair of micro-bumps 614, MIMs 612 and 618 may be included in power die 602 and core die 604, respectively.

Figure 7A:
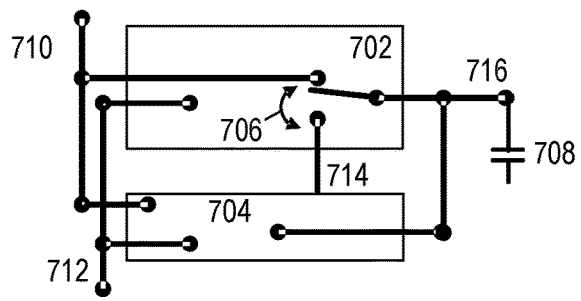
FIGS. 7A & 7B illustrate diagrams of multi-level distributed clamps, according to some embodiments.
Figure 7B:
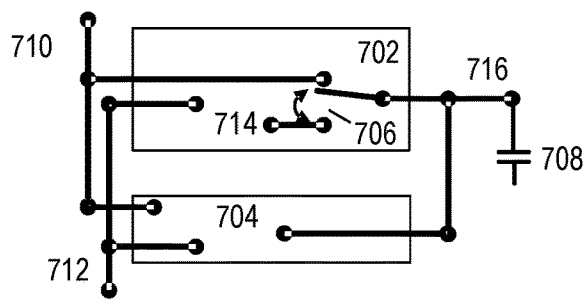

FIGS. 7A & 7B illustrate diagrams of multi-level distributed clamps, according to some embodiments. As shown in FIG. 7A, circuit 700 includes multi-level clamp 702, voltage regulator 704, switch 706, MIM 708, high voltage input 710, ground 712, intermediate voltage 714, and voltage output 716. Multi-level clamp 702 and voltage regulator 704 may include any number of active and/or passive components, such as diodes, transistors, resistors, capacitors, etc. to be able to regulate and transmit power using any known circuits and techniques. As shown, multi-level clamp 702 and voltage regulator 704 are distinct, however in some embodiments, multi-level clamp 702 and voltage regulator 704 may be co-integrated. While one multi-level clamp 702 and one voltage regulator 704 are shown, in some embodiments many independent distributed multi-level clamps 702 are coupled with each voltage regulator 704.

In some embodiments, voltage regulator 704 receives high voltage input 710 and ground 712 as inputs, and generates outputs of voltage output 716 and intermediate voltage 714. In some embodiments, high voltage input 710 may be on the order of several volts, while voltage output 716 may be less than one volt. In some embodiments, intermediate voltage 714 is generated by voltage regulator 704 and provided to multi-level clamps 702.

In some embodiments, multi-level clamp 702 may receive high voltage input 710 and ground 712 as inputs, and may selectively couple with voltage output 716. In some embodiments, switch 706 may respond to a drop in voltage output 716, for example upon a spike in power demand, to couple high voltage input 710 or intermediate voltage 714 with voltage output 716.

FIG. 7B shows an alternate multi-level distributed clamp embodiment. As shown in circuit 750, multi-level clamp 702 may internally generate intermediate voltage 714, which may be selectively outputted by switch 706.

Figure 8:
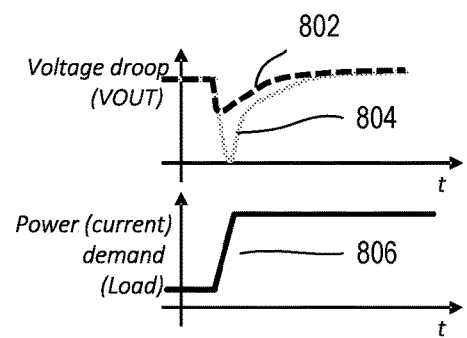
FIG. 8 illustrates a graph of example voltage droops, according to some embodiments.

FIG. 8 illustrates a graph of example voltage droops, according to some embodiments. As shown, graph 800 includes improved voltage output 802, unimproved voltage output 804, and power demand 806. In some embodiments, distributed multi-level clamps, as described above, may be able to respond to a spike in power demand 806, by switching a higher voltage to the active core and thereby mitigating voltage droop (improved voltage output 802). Unimproved voltage output 804 may represent conventional responses to spikes in power demand where longer current loops are less likely to prevent a droop from occurring.

Figure 9:
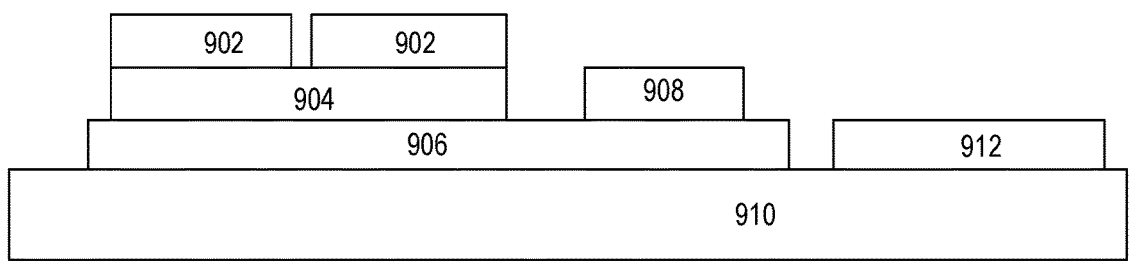
FIG. 9 illustrates a cross-sectional view of an example system including multi-level distributed clamps, according to some embodiments.

FIG. 9 illustrates a cross-sectional view of an example system including multi-level distributed clamps, according to some embodiments. As shown, system 900 includes core dies 902, power die 904, package substrate 906, package component 908, system board 910, and system component 912. In some embodiments, multiple core dies 902 may be coupled with a power die 904, which may include distributed multi-level clamps as described above. Power die 904 may be coupled with package substrate 906, which may be a printed circuit board or other substrate. Package component 908 may also be coupled with package substrate 906 and may include power delivery or non-power delivery components. Package substrate 906 may be coupled, by solder or socket, for example, with system board 910, which may be a multi-layer fiberglass motherboard. System board 910 may house additional system components, such as system component 912, which may be a memory, a controller, or other system component.

Figure 10:
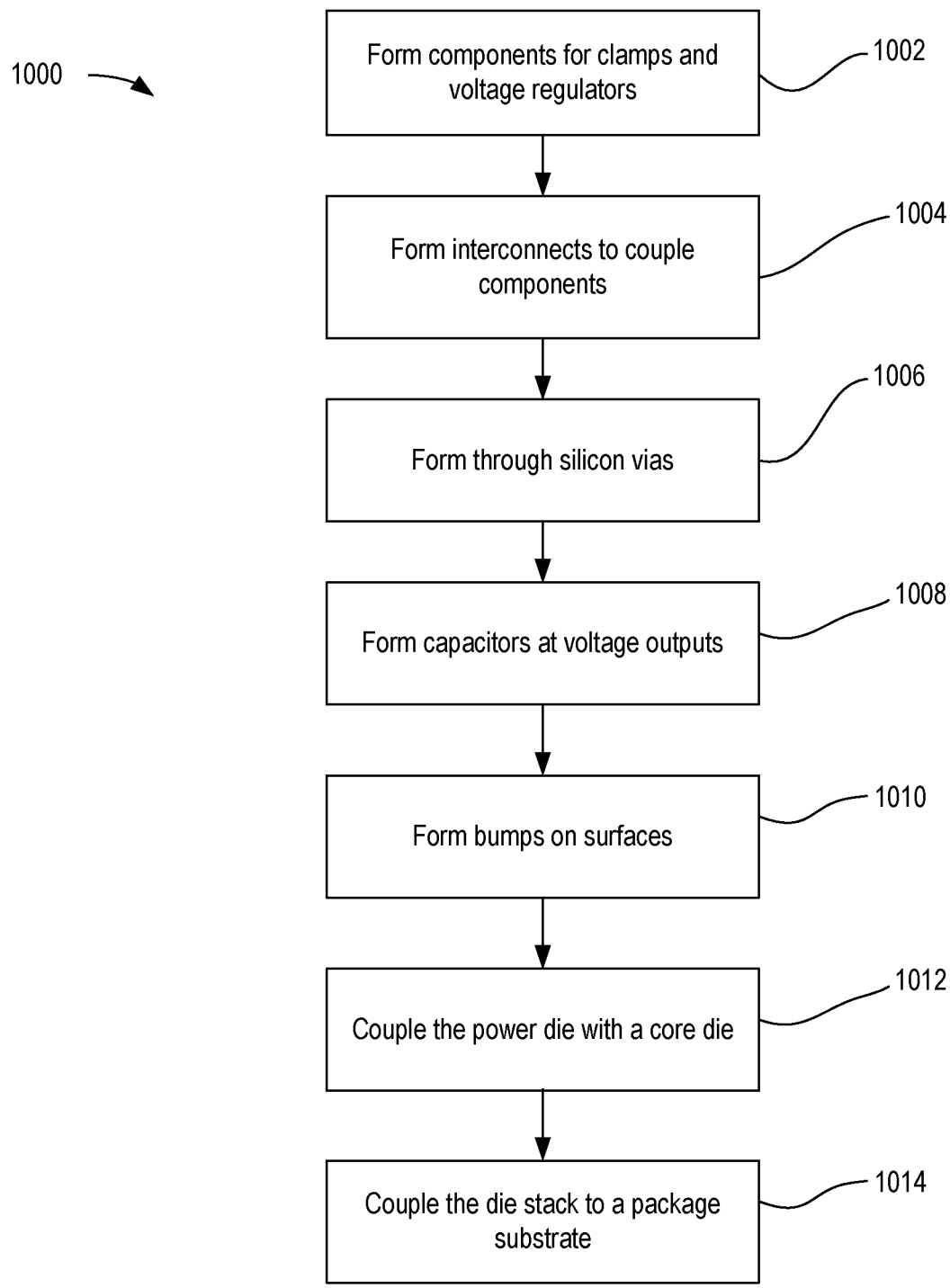
FIG. 10 illustrates a flowchart of a method of forming a system including multi-level distributed clamps, in accordance with some embodiments.

FIG. 10 illustrates a flowchart of a method of forming a system including multi-level distributed clamps, in accordance with some embodiments. Although the blocks in the flowchart with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 1000 begins with forming (1002) active components for clamps and voltage regulators. In some embodiments, a semiconductor substrate may have transistors, diodes, and other components (such as those in power circuits 306) formed as part of a power delivery solution. Next, interconnects are formed (1004) to couple components. In some embodiments, interconnects for input voltages (such as 710) and output voltages (such as 716) are routed between voltage regulator 704 and multi-level clamps 702.

Then, through silicon vias (TSVs) may be formed (1006). In some embodiments, TSVs 516 are shared by multi-level clamps 518 and voltage regulator 520 to receive input voltages. Next, capacitors may be formed (1008) at voltage outputs. In some embodiments, MIM 708 may be included at voltage output 716.

The method continues with forming (1010) bumps on surfaces. In some embodiments, C4 bumps (310) are formed on a package side of a power die, which micro-bumps (318) are formed on a core die side of a power die. Next, a core die, such as 304, may be coupled (1012) with a power die, such as 302. In some embodiments, multiple core dies 902 may be coupled with a power die 904.

Finally, the (power/core) die stack may be coupled (1014) with a package substrate. In some embodiments, package substrate 906 may also include other package components (908) and may further be coupled with a system board (910).

Figure 11:
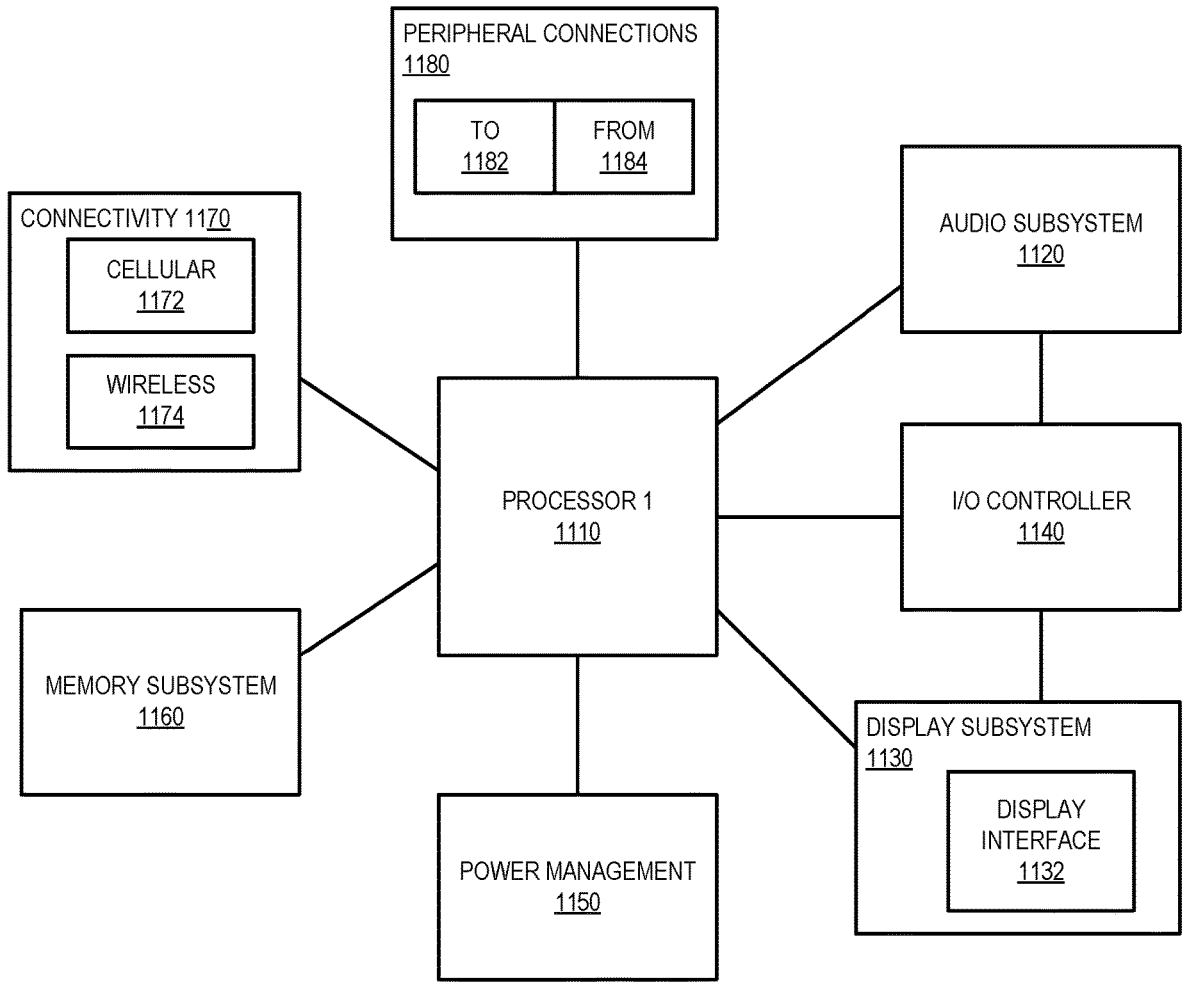
FIG. 11 illustrates a smart device or a computer system or a SoC (System-on-Chip) which includes multi-level distributed clamps, according to some embodiments.

FIG. 11 illustrates a smart device or a computer system or a SoC (System-on-Chip) 1100 which includes multi-level distributed clamps, according to some embodiments. In some embodiments, computing device 1100 represents a mobile computing device, such as a computing tablet, a mobile phone or smart-phone, a wireless-enabled e-reader, or other wireless mobile device. It will be understood that certain components are shown generally, and not all components of such a device are shown in computing device 1100. In some embodiments, one or more components of computing device 1100, for example processor 1110 and/or memory subsystem 1160, include a stacked die package with multi-level distributed clamps as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 1100 includes a first processor 1110. The various embodiments of the present disclosure may also comprise a network interface within 1170 such as a wireless interface so that a system embodiment may be incorporated into a wireless device, for example, cell phone or personal digital assistant.

In one embodiment, processor 1110 can include one or more physical devices, such as microprocessors, application processors, microcontrollers, programmable logic devices, or other processing means. The processing operations performed by processor 1110 include the execution of an operating platform or operating system on which applications and/or device functions are executed. The processing operations include operations related to I/O (input/output) with a human user or with other devices, operations related to power management, and/or operations related to connecting the computing device 1100 to another device. The processing operations may also include operations related to audio I/O and/or display I/O.

In one embodiment, computing device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1100, or connected to the computing device 1100. In one embodiment, a user interacts with the computing device 1100 by providing audio commands that are received and processed by processor 1110.

Display subsystem 1130 represents hardware (e.g., display devices) and software (e.g., drivers) components that provide a visual and/or tactile display for a user to interact with the computing device 1100. Display subsystem 1130 includes display interface 1132, which includes the particular screen or hardware device used to provide a display to a user. In one embodiment, display interface 1132 includes logic separate from processor 1110 to perform at least some processing related to the display. In one embodiment, display subsystem 1130 includes a touch screen (or touch pad) device that provides both output and input to a user.

I/O controller 1140 represents hardware devices and software components related to interaction with a user. I/O controller 1140 is operable to manage hardware that is part of audio subsystem 1120 and/or display subsystem 1130. Additionally, I/O controller 1140 illustrates a connection point for additional devices that connect to computing device 1100 through which a user might interact with the system. For example, devices that can be attached to the computing device 1100 might include microphone devices, speaker or stereo systems, video systems or other display devices, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of the computing device 1100. Additionally, audio output can be provided instead of, or in addition to display output. In another example, if display subsystem 1130 includes a touch screen, the display device also acts as an input device, which can be at least partially managed by I/O controller 1140. There can also be additional buttons or switches on the computing device 1100 to provide I/O functions managed by I/O controller 1140.

In one embodiment, I/O controller 1140 manages devices such as accelerometers, cameras, light sensors or other environmental sensors, or other hardware that can be included in the computing device 1100. The input can be part of direct user interaction, as well as providing environmental input to the system to influence its operations (such as filtering for noise, adjusting displays for brightness detection, applying a flash for a camera, or other features).

In one embodiment, computing device 1100 includes power management 1150 that manages battery power usage, charging of the battery, and features related to power saving operation. Memory subsystem 1160 includes memory devices for storing information in computing device 1100. Memory can include nonvolatile (state does not change if power to the memory device is interrupted) and/or volatile (state is indeterminate if power to the memory device is interrupted) memory devices. Memory subsystem 1160 can store application data, user data, music, photos, documents, or other data, as well as system data (whether long-term or temporary) related to the execution of the applications and functions of the computing device 1100.

Elements of embodiments are also provided as a machine-readable medium (e.g., memory 1160) for storing the computer-executable instructions. The machine-readable medium (e.g., memory 1160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1170 includes hardware devices (e.g., wireless and/or wired connectors and communication hardware) and software components (e.g., drivers, protocol stacks) to enable the computing device 1100 to communicate with external devices. The computing device 1100 could be separate devices, such as other computing devices, wireless access points or base stations, as well as peripherals such as headsets, printers, or other devices.

Connectivity 1170 can include multiple different types of connectivity. To generalize, the computing device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1180 include hardware interfaces and connectors, as well as software components (e.g., drivers, protocol stacks) to make peripheral connections. It will be understood that the computing device 1100 could both be a peripheral device ("to" 1182) to other computing devices, as well as have peripheral devices ("from" 1184) connected to it. The computing device 1100 commonly has a "docking" connector to connect to other computing devices for purposes such as managing (e.g., downloading and/or uploading, changing, synchronizing) content on computing device 1100. Additionally, a docking connector can allow computing device 1100 to connect to certain peripherals that allow the computing device 1100 to control content output, for example, to audiovisual or other systems.

In addition to a proprietary docking connector or other proprietary connection hardware, the computing device 1100 can make peripheral connections 1180 via common or standards-based connectors. Common types can include a Universal Serial Bus (USB) connector (which can include any of a number of different hardware interfaces), Display- Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a first set of one or more contacts on a first die surface, the first set of one or more contacts to couple with contacts of an integrated circuit die; one or more multi-level voltage clamps coupled with the first set of one or more contacts, the one or more multi-level voltage clamps switchable between two or more voltages; one or more integrated voltage regulators coupled with the one or more multi-level voltage clamps, the one or more integrated voltage regulators to provide an output voltage; one or more through silicon vias (TSVs) coupled with the one or more integrated voltage regulators; and a second set of one or more contacts on a second die surface, opposite the first die surface, the second set of one or more contacts coupled with the one or more TSVs, and the second set of one or more contacts to couple with contacts of a package substrate.

In some embodiments, the first set of one or more contacts comprise pairs of contacts comprising a power contact and a ground contact. In some embodiments, the first set of one or more contacts comprise micro bumps. In some embodiments, the second set of one or more contacts comprise controlled collapse chip connection (C4) bumps. Some embodiments also include a capacitor coupling the power contact with the ground contact. Some embodiments also include two or more groupings of multi-level voltage clamps having different densities. In some embodiments, the one or more multi-level voltage clamps comprise a switchable voltage from the one or more integrated voltage regulators. In some embodiments, the one or more multi-level voltage clamps comprise a switchable voltage internally regulated.

In another example, an integrated circuit device package is provided comprising: a package substrate coupled with a die stack, wherein the die stack comprises: a first die; and a second die coupled with the first die, wherein the second die comprises: a first set of one or more contacts on a first surface, the first set of one or more contacts coupled with contacts of the first die; one or more multi-level voltage clamps coupled with the first set of one or more contacts, the one or more multi-level voltage clamps switchable between two or more voltages; one or more integrated voltage regulators coupled with the one or more multi-level voltage clamps, the one or more integrated voltage regulators to provide an output voltage; one or more through silicon vias (TSVs) coupled with the one or more integrated voltage regulators; and a second set of one or more contacts on a second surface, opposite the first surface, the second set of one or more contacts coupled with the one or more TSVs, and the second set of one or more contacts coupled with contacts of the package substrate.

In some embodiments, the first set of one or more contacts comprise pairs of contacts comprising a power contact and a ground contact. In some embodiments, the first set of one or more contacts comprise micro bumps. In some embodiments, the second set of one or more contacts comprise controlled collapse chip connection (C4) bumps. Some embodiments also include a capacitor coupling the power contact with the ground contact. Some embodiments also include two or more groupings of multi-level voltage clamps having different densities. In some embodiments, the one or more multi-level voltage clamps comprise a switchable voltage from the one or more integrated voltage regulators. In some embodiments, the one or more multi-level voltage clamps comprise a switchable voltage internally regulated.

In another example, a system is provided comprising: a printed circuit board; one or more memory components coupled with the printed circuit board; and an integrated circuit device package coupled with the printed circuit board, wherein the integrated circuit device package comprises: a package substrate coupled with a die stack, wherein the die stack comprises: a first die; and a second die coupled with the first die, wherein the second die comprises: a first set of one or more contacts on a first surface, the first set of one or more contacts coupled with contacts of the first die; one or more multi-level voltage clamps coupled with the first set of one or more contacts, the one or more multi-level voltage clamps switchable between two or more voltages; one or more integrated voltage regulators coupled with the one or more multi-level voltage clamps, the one or more integrated voltage regulators to provide an output voltage;

one or more through silicon vias (TSVs) coupled with the one or more integrated voltage regulators; and a second set of one or more contacts on a second surface, opposite the first surface, the second set of one or more contacts coupled with the one or more TSVs, and the second set of one or more contacts coupled with contacts of the package substrate.

In some embodiments, the first set of one or more contacts comprise pairs of contacts comprising a power contact and a ground contact. In some embodiments, the first set of one or more contacts comprise micro bumps. In some embodiments, the second set of one or more contacts comprise controlled collapse chip connection (C4) bumps. Some embodiments also include a capacitor coupling the power contact with the ground contact. Some embodiments also include two or more groupings of multi-level voltage clamps having different densities. In some embodiments, the one or more multi-level voltage clamps comprise a switchable voltage from the one or more integrated voltage regulators. In some embodiments, the one or more multi-level voltage clamps comprise a switchable voltage internally regulated. In some embodiments, the one or more multi-level voltage clamps are coupled with the one or more TSVs to receive an input voltage.

In another example, a method is provided comprising: forming a first set of one or more contacts on a first die surface, the first set of one or more contacts to couple with contacts of an integrated circuit die; forming one or more multi-level voltage clamps coupled with the first set of one or more contacts, the one or more multi-level voltage clamps switchable between two or more voltages; forming one or more integrated voltage regulators coupled with the one or more multi-level voltage clamps, the one or more integrated voltage regulators to provide an output voltage; forming one or more through silicon vias (TSVs) coupled with the one or more integrated voltage regulators; and forming a second set of one or more contacts on a second die surface, opposite the first die surface, the second set of one or more contacts coupled with the one or more TSVs, and the second set of one or more contacts to couple with contacts of a package substrate.

In some embodiments, forming the first set of one or more contacts comprises forming pairs of contacts comprising a power contact and a ground contact In some embodiments, forming the first set of one or more contacts comprises forming micro bumps. In some embodiments, forming the second set of one or more contacts comprises forming controlled collapse chip connection (C4) bumps. Some embodiments also include forming a capacitor coupling the power contact with the ground contact. Some embodiments also include forming two or more groupings of multi-level voltage clamps having different densities. In some embodiments, the one or more multi-level voltage clamps comprise a switchable voltage from the one or more integrated voltage regulators. In some embodiments, the one or more multi-level voltage clamps comprise a switchable voltage internally regulated.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit device package comprising:
a package substrate coupled with a die stack, wherein the die stack comprises:
   a first die; and
   a second die coupled with the first die, wherein the second die comprises:
      a first set of one or more contacts on a first surface, the first set of one or more contacts coupled with contacts of the first die;
      two or more groupings of multi-level voltage clamps coupled with the first set of one or more contacts, the two or more groupings of multi-level voltage clamps present in separate areas of the second die at different densities;
      one or more integrated voltage regulators coupled with the two or more groupings of multi-level voltage clamps, the one or more integrated voltage regulators to provide an output voltage;
      one or more through silicon vias (TSVs) coupled with the one or more integrated voltage regulators; and
      a second set of one or more contacts on a second surface, opposite the first surface, the second set of one or more contacts coupled with the one or more TSVs, and the second set of one or more contacts coupled with contacts of the package substrate.

2. The integrated circuit device package of claim 1, wherein the first set of one or more contacts comprise pairs of contacts comprising a power contact and a ground contact.

3. The integrated circuit device package of claim 2, wherein the first set of one or more contacts comprise micro bumps.

4. The integrated circuit device package of claim 2, wherein the second set of one or more contacts comprise controlled collapse chip connection (C4) bumps.

5. The integrated circuit device package of claim 1, further comprising a capacitor coupling the power contact with the ground contact.

6. The integrated circuit device package of claim 1, wherein the one or more multi-level voltage clamps comprise a switchable voltage from the one or more integrated voltage regulators.

7. The integrated circuit device package of claim 1, wherein the one or more multi-level voltage clamps comprise a switchable voltage internally regulated.

8. A system comprising:
a printed circuit board;
one or more memory components coupled with the printed circuit board; and
an integrated circuit device package coupled with the printed circuit board, wherein the integrated circuit device package comprises:
   a package substrate coupled with a die stack, wherein the die stack comprises:
      a first die; and
      a second die coupled with the first die, wherein the second die comprises:
         a first set of one or more contacts on a first surface, the first set of one or more contacts coupled with contacts of the first die;
         two or more groupings of multi-level voltage clamps coupled with the first set of one or more contacts, the two or more groupings of multi-level voltage clamps present in separate areas of the second die at different densities;

one or more integrated voltage regulators coupled with the two or more groupings of multi-level voltage clamps, the one or more integrated voltage regulators to provide an output voltage;

one or more through silicon vias (TSVs) coupled with the one or more integrated voltage regulators; and a second set of one or more contacts on a second surface, opposite the first surface, the second set of one or more contacts coupled with the one or more TSVs, and the second set of one or more contacts coupled with contacts of the package substrate.

9. The system of claim 8, wherein the first set of one or more contacts comprise pairs of contacts comprising a power contact and a ground contact.

10. The system of claim 9, wherein the first set of one or more contacts comprise micro bumps.

11. The system of claim 9, wherein the second set of one or more contacts comprise controlled collapse chip connection (C4) bumps.

12. The system of claim 8, further comprising a capacitor coupling the power contact with the ground contact.

13. The system of claim 8, wherein the one or more multi-level voltage clamps comprise a switchable voltage from the one or more integrated voltage regulators.

14. The system of claim 8, wherein the one or more multi-level voltage clamps comprise a switchable voltage internally regulated.

15. The system of claim 8, wherein the one or more multi-level voltage clamps are coupled with the one or more TSVs to receive an input voltage.

\* \* \* \* \*